(12) United States Patent
Huang et al.

(10) Patent No.: US 9,831,251 B2
(45) Date of Patent: Nov. 28, 2017

(54) METHOD OF FABRICATING SEMICONDUCTOR DEVICE AND SEMICONDUCTOR DEVICE FABRICATED THEREBY

(71) Applicant: Shanghai Huali Microelectronics Corporation, Shanghai (CN)

(72) Inventors: Qiuming Huang, Shanghai (CN); Jun Tan, Shanghai (CN); Jianqin Gao, Shanghai (CN); Jian Zhong, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/235,235

(22) Filed: Aug. 12, 2016

(65) Prior Publication Data
US 2017/0250186 A1 Aug. 31, 2017

(30) Foreign Application Priority Data
Feb. 26, 2016 (CN) .......................... 2016 1 0107952

(51) Int. Cl.
*H01L 27/11* (2006.01)
*H01L 21/762* (2006.01)
*H01L 29/06* (2006.01)
*H01L 29/10* (2006.01)
*H01L 29/36* (2006.01)
*H01L 29/78* (2006.01)

(52) U.S. Cl.
CPC .... *H01L 27/1104* (2013.01); *H01L 21/76224* (2013.01); *H01L 29/0649* (2013.01); *H01L 29/1054* (2013.01); *H01L 29/36* (2013.01); *H01L 29/7849* (2013.01)

(58) Field of Classification Search
CPC ......... H01L 29/66628; H01L 29/66636; H01L 29/665; H01L 29/41783; H01L 29/66545
See application file for complete search history.

(56) References Cited

U.S. PATENT DOCUMENTS 8,647,953 B2 * 2/2014 Liao .................. H01L 29/66636
257/19

* cited by examiner

*Primary Examiner* — Quoc Hoang
(74) *Attorney, Agent, or Firm* — Tianchen LLC

(57) ABSTRACT

A method of fabricating a semiconductor device is disclosed. The method includes the steps of forming recesses in a semiconductor substrate; epitaxial growing a first SiGe seed layer with constant Ge content in the recesses; epitaxial growing a second SiGe layer with a constant Ge content higher than the Ge content of first SiGe seed layer on the first SiGe seed layer; epitaxial growing a third SiGe layer with a constant Ge content lower than the Ge content of the second SiGe layer; and forming a cap layer on the third SiGe layer.

9 Claims, 2 Drawing Sheets

METHOD OF FABRICATING SEMICONDUCTOR DEVICE AND SEMICONDUCTOR DEVICE FABRICATED THEREBY

CROSS-REFERENCE TO RELATED APPLICATION

This application claims the priority benefit of China patent application serial No. 201610107952.2 filed Feb. 26, 2016. The entirety of each of the above-mentioned patent applications is hereby incorporated by reference herein and made a part of this specification.

FIELD OF THE INVENTION

The present invention relates to semiconductor manufacturing technology, and more particularly, to a method of fabricating semiconductor devices and semiconductor devices fabricated thereby.

BACKGROUND OF THE INVENTION

With the increasing development of integrated circuit and decreasing size of field effect transistors, stress technology is introduced into semiconductor fabrication to change the lattice structures of the channel, so as to improve the carrier mobility in the channel. From the present research, tensile stress applied on the channel improves the electron mobility, while compressive stress applied on the channel improves the hole mobility. Embedded SiGe technology, which embeds SiGe in the source/drain regions of the PMOS devices to apply compressive stress on the channel region, is widely used to increase the performance of PMOS devices.

In the embedded SiGe process, the increase of Ge content in the SiGe layer will raise the stress to the channel, which improves the performance of the PMOS devices. However, due to the rising Ge content difference between the Si substrate and SiGe layer, lattice mismatch also increases, which results in the dislocation between the Si substrate and SiGe layer and the degradation of the device performance.

Moreover, due to the selectivity of epitaxial growth (the epitaxial growth rate GR on different crystal orientations ranks as $GR_{<100>} > GR_{<110>} > GR_{<111>}$), a <111> crystal plane is prone to be formed on opposing sides of the SiGe epitaxial layer when the SiGe epitaxial layer is higher than the substrate surface in SRAM regions. However, the <111> crystal plane resist to the growth of a subsequent cap layer, resulting in poor uniformity of the cap layer in the SRAM regions (the cap layer growing on the <111> crystal plane has a very small thickness). On the other hand, since the SiGe epitaxial layer with high Ge content is incapable to react with the metallic Ni to form metal silicide such as NiSi or NiGeSi, bad contact between the SiGe epitaxial layer and subsequent contact holes may occur to cause problems such as electric leakage, rising or uncontrollable resistance.

In view of the drawbacks with the prior art, there exists a need to develop a new method which increases the content of Ge in the SiGe source/drain regions, reduces or eliminates dislocations, improves the profile of the cap layer, and facilitates the formation of the metal silicide (NiSi) at the same time.

BRIEF SUMMARY OF THE DISCLOSURE

In view of the drawbacks with the prior art, present invention provides a method to increase the content of Ge in SiGe source/drain regions, reduce or eliminate dislocations, improve the profile of cap layer, and facilitate the formation of the metal silicide (NiSi) at the same time.

To achieve the above objects, the present invention provides a method of fabricating a semiconductor device which includes:

Step 1: providing a semiconductor substrate, forming shallow trench isolations in SRAM regions in the semiconductor substrate, and forming a mask layer on the semiconductor substrate;

Step 2: patterning the mask layer and etching to form at least one recess in the semiconductor substrate;

Step 3: epitaxial growing a first SiGe seed layer with a constant Ge content;

Step 4: epitaxial growing a second SiGe layer with a constant Ge content on the first SiGe seed layer, wherein the Ge content of the second SiGe layer is higher than that of the first SiGe seed layer;

Step 5: epitaxial growing a third SiGe layer with a constant Ge content on the second SiGe layer, wherein the Ge content of the third SiGe layer is lower than that of the second SiGe layer, wherein the cap layer is a Si epitaxial cap layer;

Step 6: forming a cap layer on the third SiGe layer.

Preferably, the semiconductor device is a PMOS device.

Preferably, each of the at least one recess is U-shaped or Σ-shaped.

Preferably, the Ge content of the first SiGe seed layer is in a range of 1% to 25%.

Preferably, the Ge content of the second SiGe layer is in a range of 25% to 45%.

Preferably, the Ge content of the third SiGe layer is in a range of 1% to 40%.

Preferably, the thickness of the first SiGe seed layer is in a range of 10 to 300 Å, the thickness of the second SiGe layer is in a range of 100 to 800 Å, the thickness of the third SiGe layer is in a range of 10 to 300 Å.

Preferably, the thickness of the cap layer is in the range of 10 to 300 Å.

Preferably, the second SiGe layer, the third SiGe layer, and the cap layer contains in-situ doped boron, and the concentration of boron is less than $2 \times 10^{21}$ cm$^{-3}$.

The present invention also provides a semiconductor device fabricated by the above method.

DETAILED DESCRIPTION OF THE EMBODIMENTS

Reference will now be made in detail to the present preferred embodiments of the invention, examples of which are illustrated in the accompanying drawings. The figures referred to are not necessarily drawn to scale, should be understood to provide a representation of particular embodiments of the invention, and are merely conceptual in nature and illustrative of the principle involved. In the figures, each identical, or substantially similar component that is illustrated in various figures is typically represented by a single numeral or notation.

The present invention provides an improved SiGe epitaxial growth technology, which reduces or eliminates dislocations in the SiGe layer, increases the content of Ge in the SiGe layer, improves the profile of the cap layer, and facilitates the formation of the subsequent metal silicide (NiSi).

FIGS. 1-6 show processing steps of the fabricating method of a semiconductor device in a preferred embodiment of the present invention. The method is particularly suitable to fabricate a PMOS device.

As shown in FIGS. 1-6, in a preferred embodiment of the present invention, the fabricating method includes the following steps.

Figure 1:
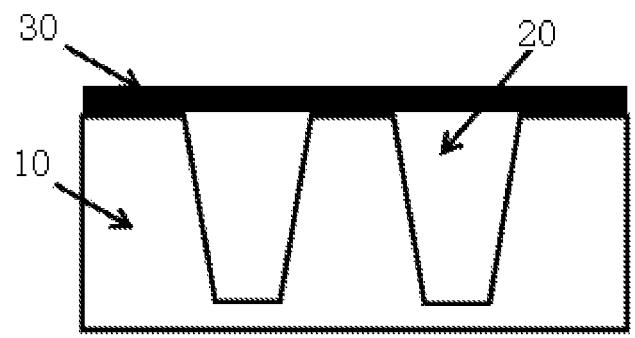
FIG. 1 is a cross-sectional view of a semiconductor structure at the first stage of the fabricating method of a semiconductor device according to an embodiment of the present invention.

Step 1: as shown in FIG. 1, a semiconductor substrate 10 is provided, shallow trench isolations 20 are formed in SRAM regions in the semiconductor substrate 10, and a mask layer 30 is formed on the semiconductor substrate 10.

The semiconductor substrate can be a single crystal silicon substrate, or other semiconductor substrate such as a SOI substrate.

Figure 2:
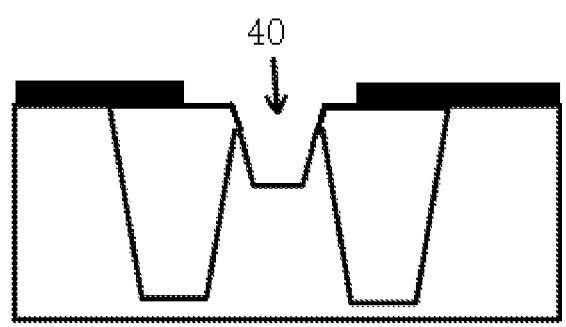
FIG. 2 is a cross-sectional view of a semiconductor structure at the second stage of the fabricating method of a semiconductor device according to an embodiment of the present invention.

Step 2: as shown in FIG. 2, the mask layer 30 is patterned and the semiconductor substrate 10 is etched by using the patterned mask layer 30 as a mask to form at least one recess 40. Preferably, each recess 40 is U-shaped or Σ-shaped.

Figure 3:
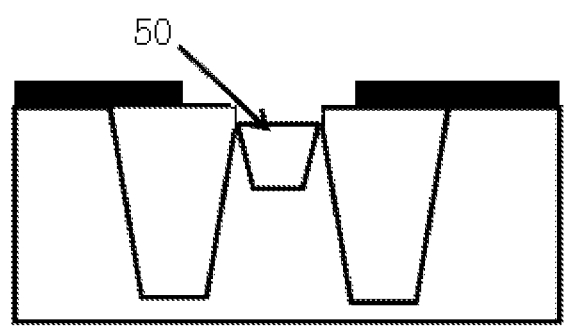
FIG. 3 is a cross-sectional view of a semiconductor structure at the third stage of the fabricating method of a semiconductor device according to an embodiment of the present invention.
Figure 4:
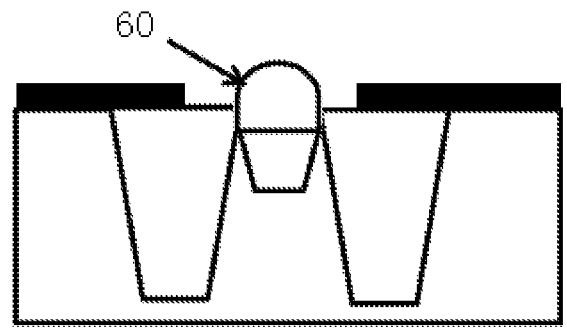
FIG. 4 is a cross-sectional view of a semiconductor structure at the fourth stage of the fabricating method of a semiconductor device according to an embodiment of the present invention.
Figure 5:
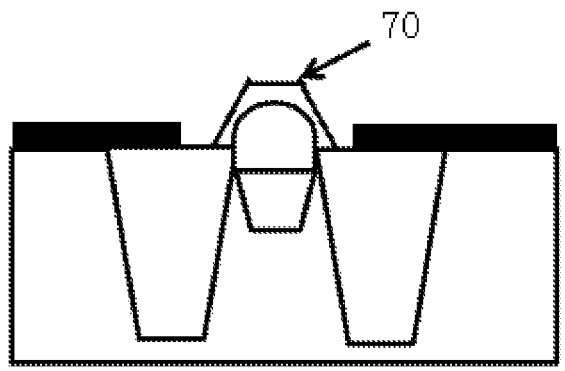
FIG. 5 is a cross-sectional view of a semiconductor structure at the fifth stage of the fabricating method of a semiconductor device according to an embodiment of the present invention.

Step 3: as shown in FIG. 3, a first SiGe seed layer 50 with a constant Ge content is epitaxial grown in the at least one recess 40;

Step 4: as shown in FIG. 4, a second SiGe layer 60 with a constant Ge content is epitaxial grown on the first SiGe seed layer 50; wherein the Ge content of the second SiGe layer 60 is higher than that of the first SiGe seed layer 50;

Step 5: as shown in FIG. 5, a third SiGe layer 70 with a constant Ge content is epitaxial grown on the second SiGe layer 60; wherein the Ge content of the third SiGe layer 70 is lower than that of the second SiGe layer 60.

Figure 6:
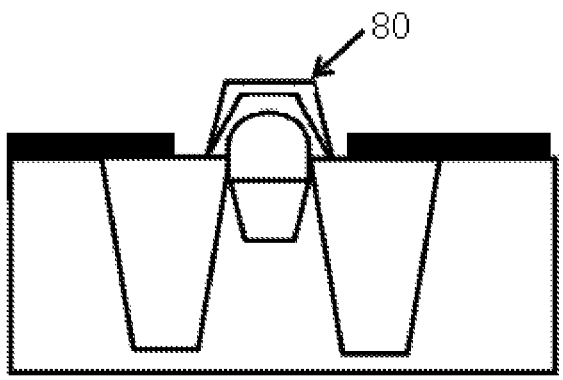
FIG. 6 is a cross-sectional view of a semiconductor structure at the sixth stage of the fabricating method of a semiconductor device according to an embodiment of the present invention.

Step 6: as shown in FIG. 6, a cap layer 80 is formed on the third SiGe layer 70. Preferably, the cap layer 80 is a Si epitaxial cap layer.

By the fabricating method of the present invention, since the second SiGe layer has a higher Ge content than the first SiGe layer and the third SiGe layer, the stress applied to the channel region can be increased while an occurrence of dislocations due to the crystal mismatches at the interface between the substrate and the first SiGe layer, the interface between the first and second SiGe layers, the interface between the second and third SiGe layers, or the interface between the third SiGe layer and the cap layer is decreased. Furthermore, since the third SiGe layer with lower Ge content is formed between the second SiGe layer with high Ge content and the cap layer, the profile of the second SiGe layer as well as the cap layer in the SRAM regions can be improved, which facilitates the formation of the subsequent metal silicide (NiSi).

In a preferred embodiment, the Ge content of the first SiGe seed layer 50 is in a range of 1% to 25% (mass-content). In a preferred embodiment, the Ge content of the second SiGe layer 60 is in a range of 25% to 45% (mass-content). In a preferred embodiment, the Ge content of the third SiGe layer 70 is in a range of 1% to 40% (mass-content).

In a preferred embodiment, a thickness of the first SiGe seed layer 50 is in a range of 10 to 300 Å, the thickness of the second SiGe layer 60 is in a range of 100 to 800 Å (the top surface of the second SiGe layer 60 can either below, at same level with, or above the surface of the substrate); a thickness of the third SiGe layer 70 is in a range of 10 to 300 Å; a thickness of the cap layer 80 is in a range of 10 to 300 Å.

In a preferred embodiment, the second SiGe layer 60, the third SiGe layer 70, and the cap layer 80 contains in-situ doped B, wherein the concentration of B is less than $2 \times 10^{21}$ cm$^{-3}$.

In a preferred embodiment, during the epitaxial growth, the processing temperature is in a range of 590 to 1200° C., the pressure in a reaction chamber is a the range of 5 to 800 Torr.

In a preferred embodiment, during the epitaxial growth, the reactant gases includes $SiH_4$, $SiH_2Cl_2$, HCL, $H_2$, $GeH_4$, and $B_2H_6$. Wherein a flow rate of Hz is in a range of 1000 to 60000 sccm; a flow rate ratio between $GeH_4$ and $SiH_4$ or a flow rate ratio between $GeH_4$ and $SiH_2Cl_2$ is in a range of 1:0.01 to 1:100; a flow rate ratio between $GeH_4$ and HCL is in a range of 1:0.05 to 1:50.

It will be understood that, the terms such as "first", "second" and "third" recited in the present application are merely identifiers, but do not have any other meanings, for example, a particular order and the like.

The foregoing outlines features of several embodiments so that those skilled in the art may better understand the aspect of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of fabricating a semiconductor device comprising the steps of:
   Step 1: providing a semiconductor substrate, forming shallow trench isolations in SRAM regions in the semiconductor substrate, and forming a mask layer on the semiconductor substrate;
   Step 2: patterning the mask layer and etching the semiconductor substrate to form at least one recess in the semiconductor substrate;
   Step 3: epitaxial growing a first SiGe seed layer with a constant Ge content in the at least one recess;
   Step 4: epitaxial growing a second SiGe layer with a constant Ge content on the first SiGe seed layer, wherein the Ge content of the second SiGe layer is higher than that of the first SiGe seed layer;

Step 5: epitaxial growing a third SiGe layer with a constant Ge content on the second SiGe layer, wherein the Ge content of the third SiGe layer is lower than that of the second SiGe layer;

Step 6: forming a cap layer on the third SiGe layer, wherein the cap layer is a Si epitaxial cap layer.

2. The method according to claim 1, wherein the semiconductor device is a PMOS device.

3. The method according to claim 1, wherein each of the at least one recess is U-shaped or Σ-shaped.

4. The method according to claim 1, wherein the Ge content of the first SiGe seed layer is in a range of 1% to 25%.

5. The method according to claim 1, wherein the Ge content of the second SiGe layer is in a range of 25% to 45%.

6. The method according to claim 1, wherein the Ge content of the third SiGe layer is in a range of 1% to 40%.

7. The method according to claim 1, wherein the thickness of the first SiGe seed layer is in a range of 10 to 300 Å; the thickness of the second SiGe layer is in a range of 100 to 800 Å; the thickness of the third SiGe layer is in a range of 10 to 300 Å.

8. The method according to claim 1, wherein the thickness of the cap layer is in a range of 10 to 300 Å.

9. The method according to claim 1, wherein the second SiGe layer, the third SiGe layer, and the cap layer contain in-situ doped boron, wherein the concentration of the boron is less than $2\times10^{21}$ cm$^{-3}$.

* * * * *